US010854621B2

(12) United States Patent
Hua et al.

(10) Patent No.: US 10,854,621 B2
(45) Date of Patent: Dec. 1, 2020

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Wenyu Hua, Wuhan (CN); Fandong Liu, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/402,197

(22) Filed: May 2, 2019

(65) Prior Publication Data
US 2020/0273872 A1 Aug. 27, 2020

Related U.S. Application Data

(63) Continuation of application No. PCT/CN2019/076185, filed on Feb. 26, 2019.

(51) Int. Cl.
H01L 27/115 (2017.01)
H01L 27/11565 (2017.01)
H01L 27/11582 (2017.01)

(52) U.S. Cl.
CPC .. H01L 27/11565 (2013.01); H01L 27/11582 (2013.01)

(58) Field of Classification Search
CPC ......... H01L 27/11524; H01L 27/11529; H01L 27/11551–11556
See application file for complete search history.

(56) References Cited

U.S. PATENT DOCUMENTS

2011/0151667 A1 6/2011 Hwang et al.
2016/0276360 A1 9/2016 Doda et al.

FOREIGN PATENT DOCUMENTS

| CN | 104157654 A | 11/2014 |
| CN | 107068687 A | 8/2017 |
| CN | 107482013 A | 12/2017 |
| CN | 107658306 A | 2/2018 |
| CN | 107658308 A * | 2/2018 |

(Continued)

OTHER PUBLICATIONS

International Search Report issued in corresponding International Application No. PCT/CN2019/076185, dated Oct. 25, 2019, 4 pages.

(Continued)

Primary Examiner — Syed I Gheyas
(74) Attorney, Agent, or Firm — Bayes PLLC

(57) ABSTRACT

Embodiments of a three-dimensional (3D) memory device are provided. The 3D memory device includes a substrate, a memory stack with interleaved conductive layers and dielectric layers over the substrate, an array of channel structures each extending vertically through the memory stack, and a plurality of contact hole structures each extending vertically through the memory stack and electrically connected to a common source of one or more of the channel structures. At least one of the plurality of contact hole structures is surrounded by a plurality of the channel structures of nominally equal lateral distances to the respective contact hole structure.

20 Claims, 11 Drawing Sheets

(56) References Cited

FOREIGN PATENT DOCUMENTS

| CN | 108807405 A | 11/2018 |
|----|-------------|---------|
| CN | 108962910 A | 12/2018 |
| CN | 109300907 A | 2/2019 |
| WO | 2019027541 A1 | 2/2019 |

OTHER PUBLICATIONS

Written Opinion of the International Searching Authority issued in corresponding International Application No. PCT/CN2019/076185, dated Oct. 25, 2019, 5 pages.

* cited by examiner

THREE-DIMENSIONAL MEMORY DEVICE AND METHOD FOR FORMING THE SAME

CROSS REFERENCE TO RELATED APPLICATION

This application is continuation of International Application No. PCT/CN2019/076185, filed on Feb. 26, 2019, entitled "THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In an example, a 3D memory device includes a substrate, a memory stack with interleaved conductive layers and dielectric layers over the substrate, an array of channel structures each extending vertically through the memory stack, and a plurality of contact hole structures each extending vertically through the memory stack and electrically connected to a common source of one or more of the channel structures. At least one of the plurality of contact hole structures may be surrounded by a plurality of the channel structures of nominally equal lateral distances to the respective contact hole structure.

In another example, a 3D memory device includes a substrate, a memory stack with interleaved conductive layers and dielectric layers over the substrate, an array of channel structures each extending vertically through the memory stack, and an insulating structure extending vertically through the array of channel structures and laterally along a boundary of the array of channel structures. The 3D memory device may also include a plurality of contact hole structures each extending vertically through the memory stack and electrically connected to a common source of one or more of the channel structures. Each of the plurality of contact hole structures may be surrounded by a plurality of the channel structures.

In still another example, a method for forming a 3D memory device includes the following operations. First, a dielectric stack comprising interleaved sacrificial layers and dielectric layers is formed over a substrate. A plurality of channel holes and a plurality of contact holes are formed through the dielectric stack. The plurality of contact holes extend vertically into the substrate and are each surrounded by a plurality of channel holes of nominally equal lateral distances to the respective contact hole in a plan view. A channel structure is formed in each of the plurality of channel holes. Then, a memory stack having interleaved conductive layers and dielectric layers is formed by replacing, through the contact holes, the sacrificial layers in the dielectric stack with the conductive layers. A spacer is formed along a sidewall of each of the plurality of contact holes to cover the conductive layers of the memory stack. A contact is formed over the spacer in each of the plurality of contact holes. The contact may be electrically connected to a common source of the plurality of channel structures.

In yet another example, a method for forming a 3D memory device includes the following operations. First, interleaved sacrificial layers and dielectric layers are alternatively deposited over a substrate. The interleaved sacrificial layers and dielectric layers may be etched through simultaneously to form a plurality of channel holes and a plurality of contact holes. The plurality of contact holes may be aligned with a portion of the plurality of channel holes in a contact row along a lateral direction in a plan view. A sealing layer may be deposited in each of the plurality of contact holes, and the sealing layer in each of the contact holes may be etched away after depositing a channel structure in each of the plurality of channel holes. Through the contact holes, the sacrificial layers may be replaced with a plurality of conductive layers. A spacer may be deposited along a sidewall of each of the contact holes.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
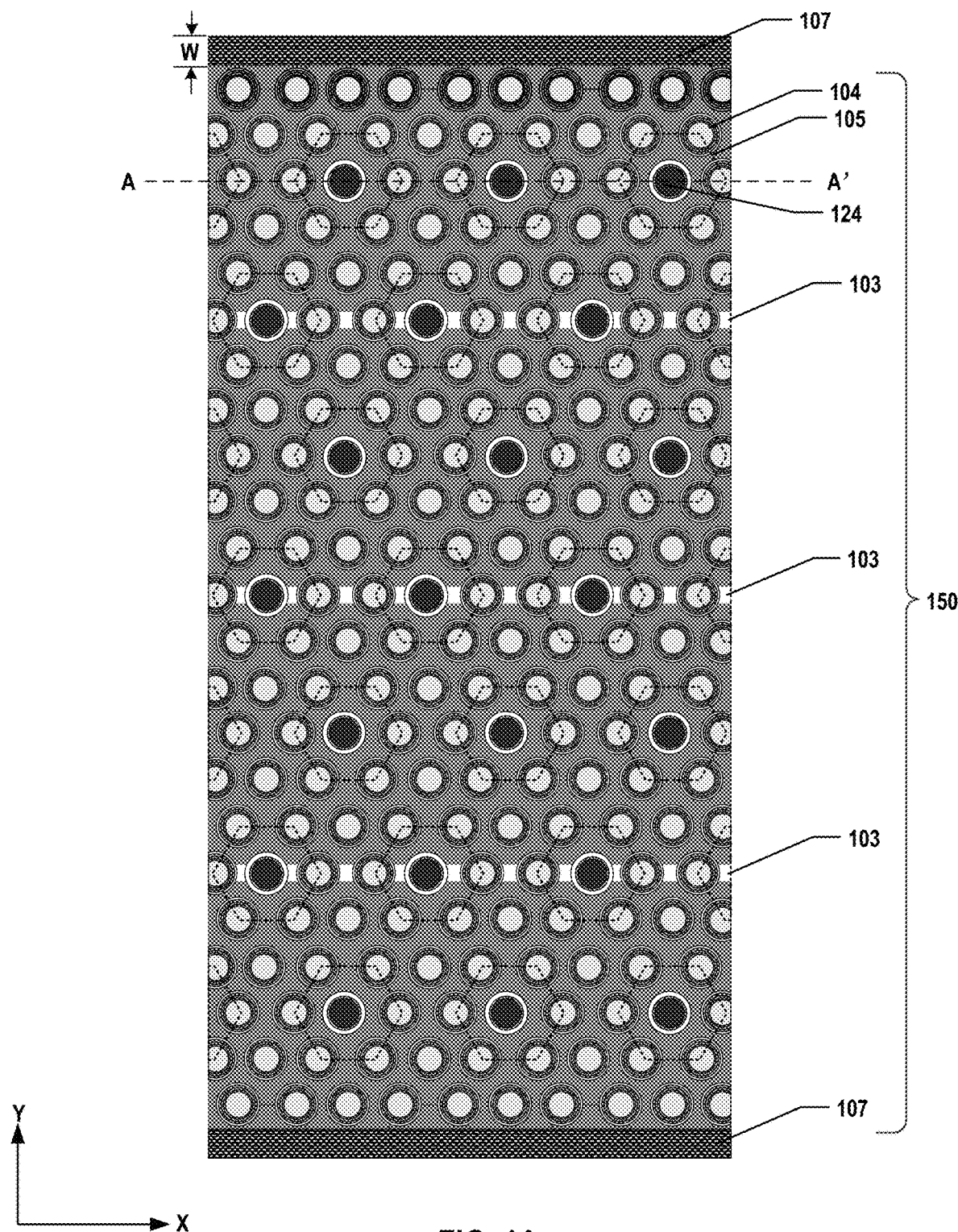
FIG. 1A illustrates a plan view of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Critical dimension of channel holes is an important factor for 3D memory devices. The fabrication and ultimate device performance of these 3D memory devices can be affected by the critical dimension of the channel holes. Especially, when 3D memory devices continue to scale down, the gate-replacement process (e.g., the process in which sacrificial layers are replaced with conductive layers to form gate electrodes/word lines) can become more challenging. For example, in some 3D memory devices, gate line slits (GLSs) are formed to separate memory regions in an array of memory strings. Often, a GLS has large dimensions and is filled with an insulation structure formed in a trench that extends laterally in the array. A source structure is also formed in the GLS and is electrically connected to an array common source (ACS) of the memory strings. The gate-replacement process in this 3D memory device often includes etching away the sacrificial layers and depositing a conductive material through the trench. The large lateral distance between a GLS and an adjacent top select gate (TSG) and small critical dimension of the channel holes (or channel structures) can cause conductive material to be unevenly filled in the lateral recesses formed after the removal of the sacrificial layers, resulting in voids in the formed gate electrodes. The gate electrode may have an undesirably high resistance. Also, because channel holes are formed between adjacent GLSs, the boundary conditions for the etching of channel holes at different locations of the array can be different due to the existence of large-area GLSs, causing channel holes to have nonuniform lateral dimensions. For example, the lateral dimensions of a channel hole may gradually vary as the channel hole moves farther away from the GLSs, causing potential performance variation of the memory cells. In addition, the threshold voltage of a memory cell may vary as the lateral distance between the memory cell (or respective channel structure) and the GLSs varies.

Figure 5:
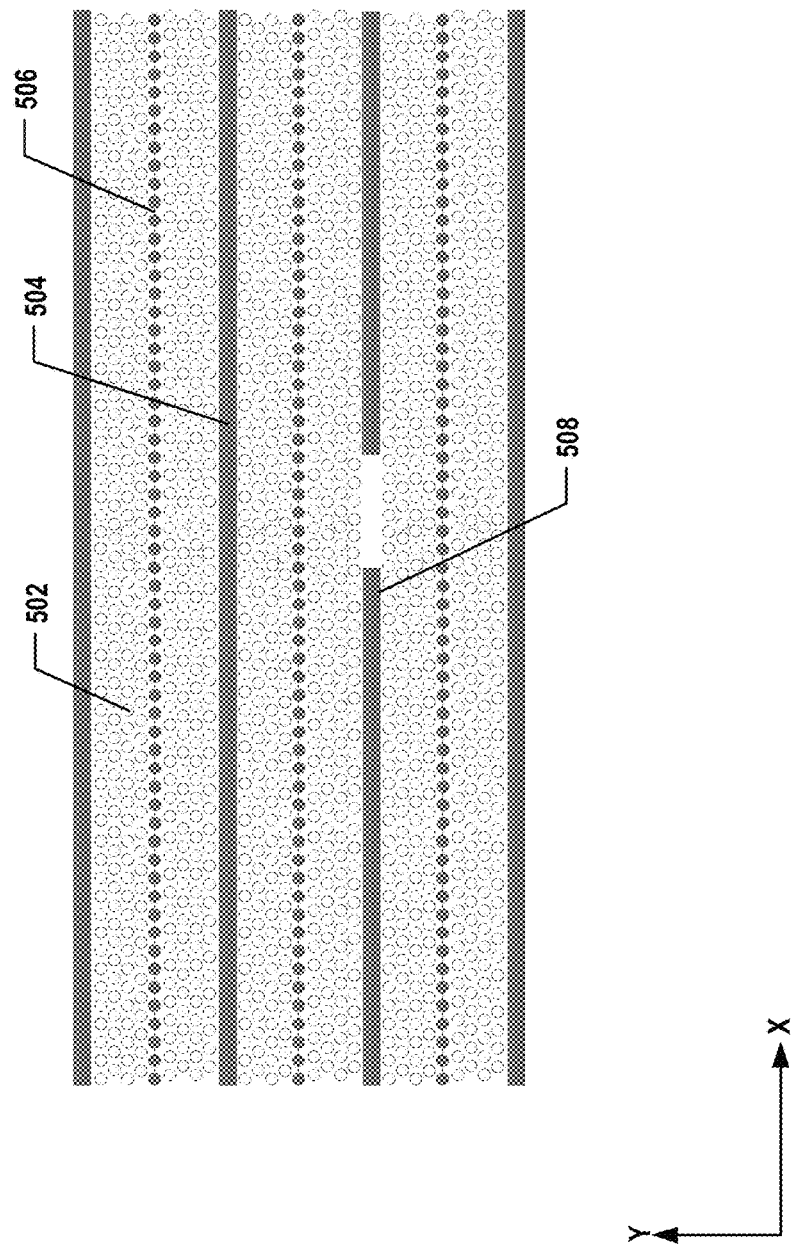
FIG. 5 illustrates a plan view of an exemplary 3D memory device having gate line slits.

For example, FIG. 5 illustrates a plan view of an exemplary 3D memory device 500 having GLSs 504. 3D memory device 500 includes an array of NAND memory strings 502 and multiple parallel GLSs 504, which divide array of NAND memory strings 502 into different memory regions (e.g., memory fingers or blocks). 3D memory device 500 also includes multiple parallel TSG cuts 506 that separate the electrical connections between TSGs of NAND memory strings 502 in different regions. As shown in FIG. 5, each GLS 504 and TSG cut 506 extends laterally along the word line direction in a straight-line pattern in the plan view (parallel to the wafer plane). It is noted that x and y axes are included in FIG. 5 to illustrate two orthogonal directions in the wafer plane. The x-direction is the word line direction, and the y-direction is the bit line direction. 3D memory device 500 also includes "H" cuts 508 that laterally separate each memory block into multiple memory fingers.

During the gate replacement processes, conductive materials for forming the gate electrodes of NAND memory strings 502 need to travel a relatively long distance between each GLS 504 and adjacent TSG cuts 506 to fill in the lateral recesses formed after the removal of sacrificial layers. This deposition process can be susceptible to formation of voids and/or nonuniformly deposited gate electrodes. The relatively long distance between a GLS 504 and an adjacent GLS 504/TSG cut 506 can also affect the uniformities of lateral dimensions and threshold voltages of NAND memory strings 502. Further, the shape of GLS 504 (e.g., having a slit shape with a dimension along the extending direction (or the x-direction) much greater than the dimension along the expanding dimension (or the y-direction)) can contribute to unbalanced variations of wafer flatness (e.g., wafer warpage bias) in different directions. The warpage bias can have an adverse impact on the photolithography process to form device patterns, leading to potential die yield loss.

Various embodiments in accordance with the present disclosure provide an improved 3D memory structure scheme suitable for solving the aforementioned issues by replacing the GLSs with contact hole structures. The 3D memory structure includes a plurality of contact hole structures distributed in the array of memory strings. Each contact hole structure may include an insulating spacer layer in a contact hole and a conductive contact in the spacer layer. In some embodiments, each contact hole structure is electrically connected to the common source of a plurality of memory strings surrounding the contact hole structure. The contact hole structures may be arranged in a pattern, e.g., an array, so the contact hole structures can be uniformly distributed in the array of memory strings. The arrangement of the contact hole structures may improve the uniformity of the threshold voltages of the memory strings.

Also, the arrangement of the contact hole structures may allow the gate electrodes/word lines to be formed with improved uniformity and quality, reducing the resistivity of the gate electrodes/word lines. For example, the gate-replacement process can be performed to deposit a conductive material through the contact holes that subsequently form the contact hole structures. Because the conductive material travels shorter distances to fill up the lateral recesses for forming the gate electrodes, the gate electrodes are less susceptible to voids or density nonuniformity.

In the present disclosure, one or more insulating structures may be formed along the boundaries of the array of memory strings to define a memory region where the contact hole structures are formed. The insulating structures may function as GLSs to separate one memory region from another. Compared to GLSs, the insulating structures may have smaller lateral area (e.g., smaller lateral width), increasing the area in the memory region for forming memory strings/cells. The channel density (or channel hole density) of the memory region may thus be increased. The contact holes, which can have the same diameter as the channel structures, can be formed by the same process that forms the channel holes, so the formation of the contact holes has minimal impact on the lateral uniformity of channel holes. Also, the smaller lateral dimensions of the insulating structures may lead to less variation in the boundary conditions for channel holes of various locations. The etching process to form the channel holes may further result in channel holes with more uniform diameters. Meanwhile, the number of TSGs and the number of channel holes formed in the memory region can be flexibly determined, e.g., based on design and/or fabrication requirements.

Figure 1B:
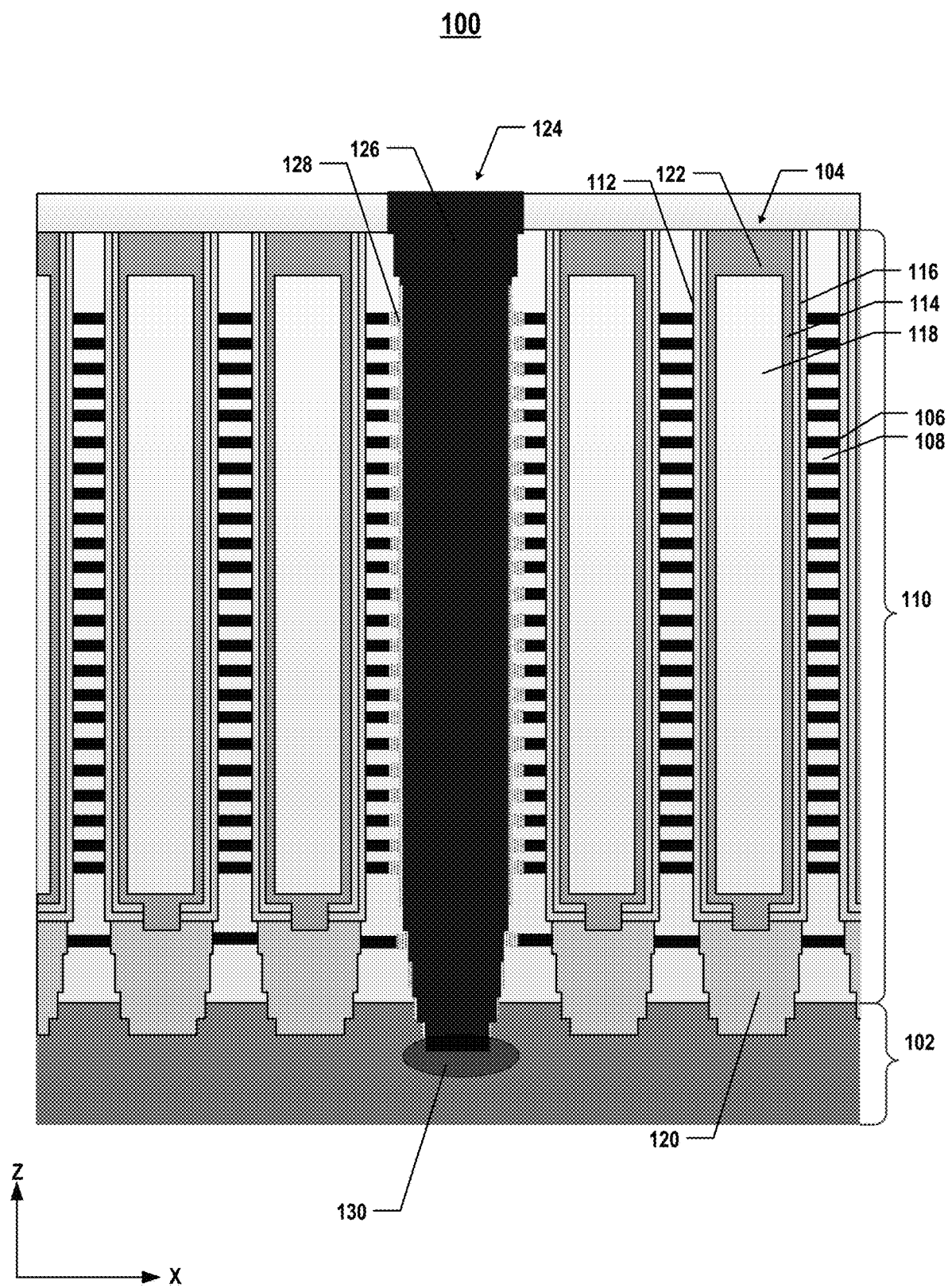
FIG. 1B illustrates a cross-sectional view of the 3D memory device shown in FIG. 1A along an A-A' direction, according to some embodiments of the present disclosure.
Figure 3:
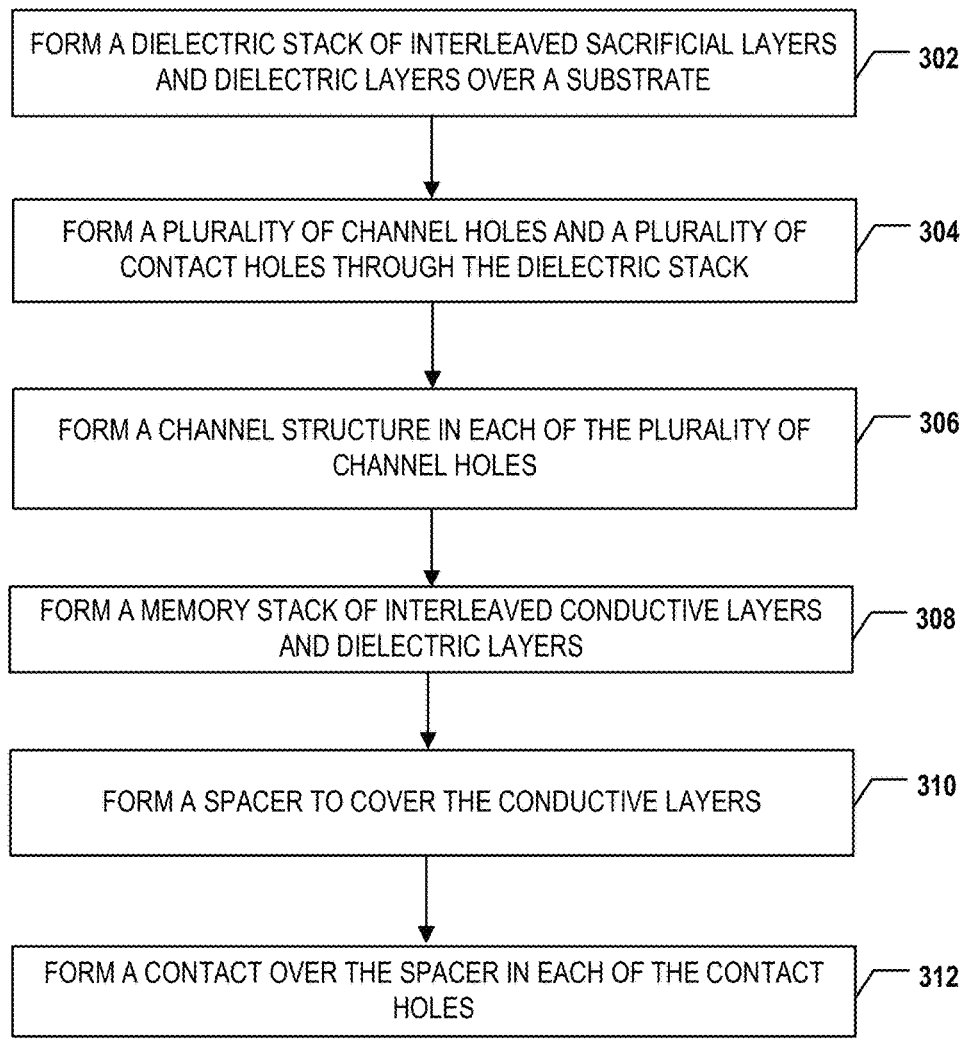
FIG. 3 illustrates a flowchart of an exemplary method for forming a 3D memory device, according to some embodiments of the present disclosure.
Figure 4:
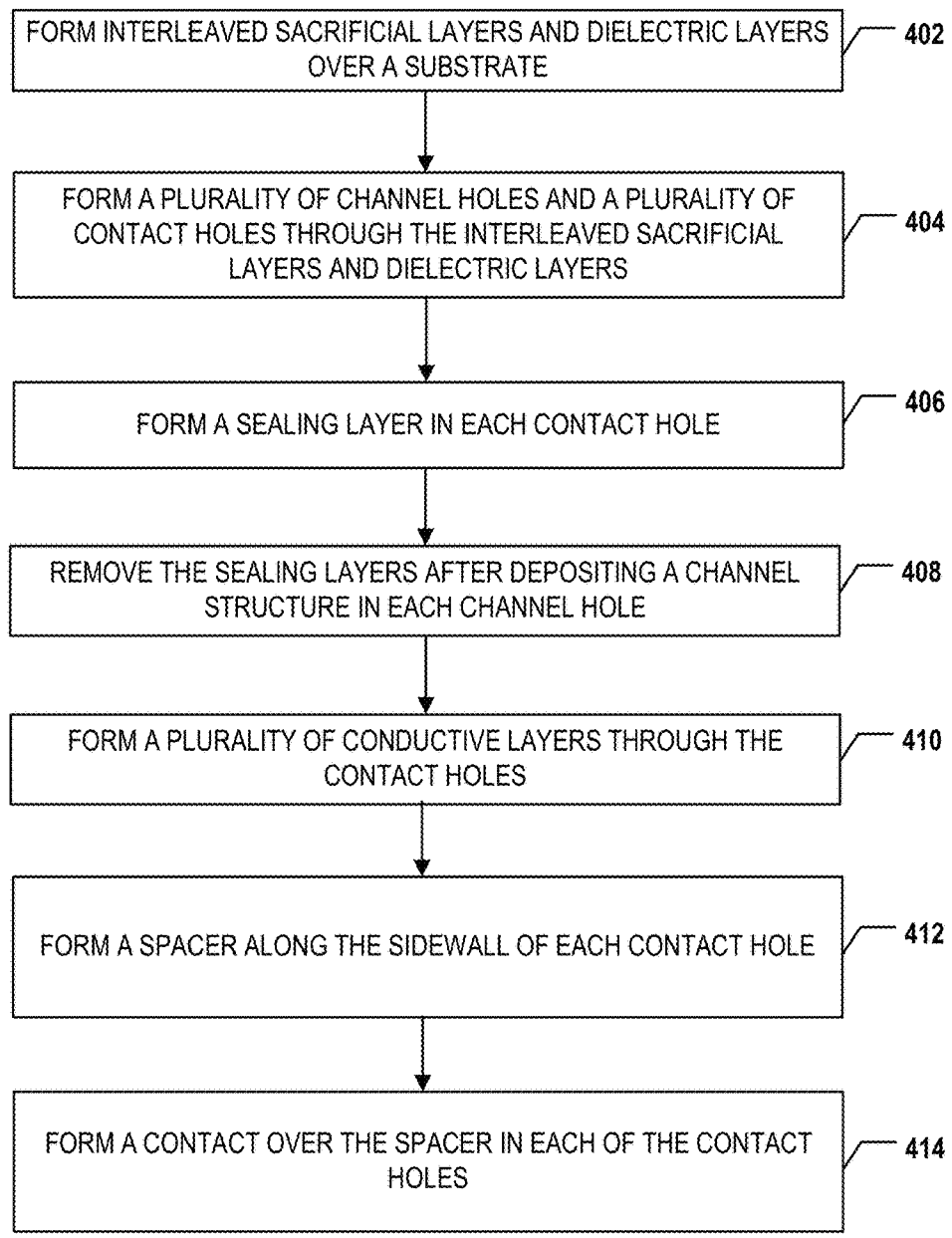
FIG. 4 illustrates a flowchart of another exemplary method for forming a 3D memory device, according to some embodiments of the present disclosure.

FIG. 1A illustrates a plan view of an exemplary 3D memory device, according to some embodiments. FIG. 1B illustrates a cross-sectional view of the 3D memory device shown in FIG. 1A. FIGS. 2A-2L illustrate cross-sectional views of the exemplary 3D memory device at various stages of an exemplary fabrication process, according to some embodiments. FIGS. 3 and 4 each illustrates an exemplary method to form a 3D memory device, according to some embodiments.

FIG. 1A illustrates a plan view of an exemplary 3D memory device 100. 3D memory device 100 may include a memory region 150, one or more insulating structures 107 located along boundaries of memory region 150, a plurality of memory strings 104 (or NAND memory strings 104) arranged in an array in memory region 150, a plurality of contact hole structures 124 distributed among memory strings 104, and a plurality of TSG cuts 103. Memory region 150, defined or separated by insulating structures 107, may be any suitable area formed with memory strings 104. Memory strings 104 may be arranged in any suitable pattern, such as an array, between insulating structures 107. Depending on the fabrication and/or design requirements, any suitable number of memory strings 104 and TSG cuts 103 may be formed between insulating structures 107.

Contact hole structures 124 may be distributed in any suitable arrangement in memory region 150, surrounded by memory strings 104. For example, contact hole structures 124 may be arranged in a pattern (e.g., arrangement with a same shape repeated at a regular interval) in the plan view. In some embodiments, contact hole structures 124 are arranged in an array. For example, as shown in FIG. 1A, contact hole structures 124 may be arranged in a plurality of parallel rows (also referred to as contact rows) each extending along the x-direction. At least two contact hole structures 124 in a contact row are separated by at least one memory string 104 in between along the x-direction. In some embodiments, each contact hole structure 124 is separated from an adjacent contact hole structure in the same contact row by at least two memory strings 104. In some embodiments, in the same contact row, two adjacent contact hole structures 124 are separated by a nominally equal lateral space or distance. Along the y-direction, adjacent contact rows may be separated by at least one row of memory strings 104. In some embodiments, adjacent contact rows are separated by at least two rows of memory strings 104. In some embodiments, two adjacent contact rows are separated by a nominally equal lateral space or distance along the y-direction. In some embodiments, the lateral space or distance between contact hole structure 124 and an adjacent contact hole structure 124 along the x-direction is nominally equal to the lateral space or distance between this contact hole structure 124 and an adjacent contact hole structure 124 in an adjacent contact row.

At least one contact hole structure 124 in a contact row is surrounded by a plurality of memory strings 104. In some embodiments, each contact hole structure 124 is surrounded by a plurality of memory strings 104 and is electrically connected to a common source of the plurality of memory strings 104. Sources of memory strings 104 that are not adjacent to a contact hole structure 124 may be electrically connected to a nearby contact hole structure 124, as determined by the design. In some embodiments, the same number of adjacent memory strings 104 may surround each contact hole structure 124. These adjacent memory strings 104 may have nominally same lateral distances to the respective surrounded contact hole structure 124. The number of adjacent memory strings 104 surrounding a contact hole structure 124 may be dependent on, e.g., the arrangement of memory strings 104 in memory region 150. In some embodiments, each contact hole structure 124 is surrounded by at least six memory strings 104.

As an example, shown in FIG. 1A, each contact hole structure 124 is surrounded by six memory strings 104 in the plan view. The six memory strings 104 may be evenly spaced around contact hole structure 124 so lines connecting the geometric centers of the six memory strings 104 form an equilateral hexagon 105. Each one of the six memory strings 104 has a nominally same lateral distance to the contact hole structure 124 located nominally at the center of equilateral hexagon 105. In this example, two of the six memory strings 104 are aligned with the contact row in which the contact hole structure 124 is located, and each two adjacent contact hole structures 124 are separated by two memory strings 104. Along the y-direction, each contact row is separated by two rows of memory strings 104. In some embodiments, the lateral space between contact hole structure 124 and each adjacent contact hole structure 124 along the x-direction is nominally the same as the lateral space between this contact hole structure 124 and each adjacent contact hole structure 124 in adjacent contact rows.

In some embodiments, the number of contact hole structures 124 in each contact row and the number/arrangement of memory strings 104 surrounding a contact hole structure 124 vary. For example, in a contact row, each two adjacent contact hole structures 124 may be separated by more or less than two memory strings 104, and/or the number of memory strings 104 surrounding a contact hole structure 124 may be more or less than six. The lateral dimensions (e.g., diameter) of a contact hole structure 124 may be nominally the same as the lateral dimensions (e.g., diameter) of memory string 104. The specific arrangement of contact hole structures 124 and memory strings 104 may be determined based on different fabrication and/or design requirements, and should not be limited by the embodiments of the present disclosure.

TSG cut 103, extending vertically (i.e., the direction perpendicular to the x-y plane) through a portion of the array of memory strings 104, may extend along the x-direction. In some embodiments, TSG cut 103 overlaps with a contact row to, e g, minimize the area on memory region 150 that is not used for forming memory strings 104 and minimize the effect on boundary condition change during the etching of channel holes. As shown in FIG. 1A, a plurality of parallel TSG cuts 103 may overlap with a plurality of contact rows in the plane view to separate the electrical connections of memory strings between TSG cuts 103 or between insulating structure 107 and TSG cut 103.

Insulating structures 107 may separate memory region 150 from other regions/parts. Insulating structures 107 may extend along the boundaries (e.g., the x-direction) of memory region 150 in the plan view and may vertically extend (e.g., the direction perpendicular to the x-y plane) through the array of memory strings 104. In some embodiments, a lateral length (e.g., dimension along the x-direction) of insulating structure 107 is nominally the same as or comparable to a lateral length of a GLS in a known 3D memory device. In some embodiments, a lateral width W (e.g., dimension along the y-direction) of insulating structure 107 is less than a lateral width of a GLS in a known 3D memory device. Insulating structures 107 may include any suitable dielectric material such as silicon oxide, silicon nitride, and/or silicon oxynitride. In some embodiments, insulating structures 107 are formed by forming trenches along the boundaries of memory region 150 and filling the trenches with the suitable dielectric material. The trenches may be formed before, after, or at the same time as the formation of channel holes.

The arrangement of contact hole structures 124 and insulating structures 107 may improve the fabrication and device performance of 3D memory device 100 in many aspects. For example, insulating structures 107 may occupy less area in the 3D memory device, allowing more memory strings 104 to be formed in memory region 150. The contact hole structures 124 are distributed amongst memory strings 104 and each has a plurality of surrounded memory strings 104 of nominally same lateral distances to the respective contact hole structure 124. In the gate-replacement process, conductive material for forming the gate electrodes may travel nominally same distances to surrounding channel holes to fill up the lateral recesses formed after the removal of sacrificial layers. This may facilitate the gate electrodes to be formed with improved uniformity and quality, reducing the resistivity of the gate electrodes. The arrangement of contact hole structures 124 also allows more memory strings 104 to be located closer and more uniformly to the respective common source. The uniformity of the threshold voltages of the memory cells formed in these memory strings 104 may be improved. Also, the arrangement and dimensions of the contact hole structures 124 can result in a reduced change of boundary conditions of channel holes at different locations in memory region 150 during the etching process. The lateral dimensions of the formed channel holes and memory strings 104 may thus have improved uniformity. Further, the number of memory strings 104 and the number of TSG cuts 103 may be flexibly determined in memory region 150. This may further increase the number of memory cells to be formed in memory region 150. The lateral dimensions and distribution of contact hole structures 124 and insulating structures 107 may also reduce warpage bias of 3D memory device 100, thus reducing the variations to the surface flatness of 3D memory device 100.

FIG. 1B illustrates a cross-sectional view of an exemplary 3D memory device 100 along the A-A' direction shown in FIG. 1A, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof.

3D memory device 100 can include memory array devices above substrate 102. It is noted that x and z axes/directions are included in FIG. 1B to further illustrate the spatial relationship of the components in 3D memory device 100. Substrate 102 includes two lateral surfaces extending laterally in the x-y plane: a top surface on the front side of the wafer on which 3D memory device 100 can be formed, and a bottom surface on the backside opposite to the front side of the wafer. The z axis is perpendicular to both the x and y axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches, not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in the form of an array of NAND memory strings 104 each extending vertically above substrate 102. The NAND memory strings 104 can extend through a plurality of pairs each including a conductive layer 106 and a dielectric layer 108 (referred to herein as "conductor/dielectric layer pairs"). The stacked conductor/dielectric layer pairs are also referred to herein as a "memory stack" 110. In some embodiments, an insulation layer (not shown) is formed between substrate 102 and memory stack 110. The number of the conductor/dielectric layer pairs in memory stack 110 (e.g., 32, 64, 96, or 128) determines the number of memory cells in 3D memory device 100. Memory stack 110 can include interleaved conductive layers 106 and dielectric layers 108. At least on one side in the lateral direction, memory stack 110 can include a staircase structure (not shown). Conductive layers 106 and dielectric layers 108 in memory stack 110 can alternate in the vertical direction. Conductive layers 106 can include conductive materials including, but not limited to, tungsten (W), cobalt (Co), copper (Cu), aluminum (Al), polysilicon, doped silicon, silicides, or any combination thereof. Dielectric layers 108 can include dielectric materials including, but not limited to, silicon oxide, silicon nitride, silicon oxynitride, or any combination thereof.

As shown in FIG. 1B, memory string 104 can include a channel structure 112 extending vertically through memory stack 110. Channel structure 112 can include a channel hole filled with semiconductor materials (e.g., as a semiconductor channel 114) and dielectric materials (e.g., as a memory film 116). In some embodiments, semiconductor channel 114 includes silicon, such as amorphous silicon, polysilicon, or single crystalline silicon. In some embodiments, memory film 116 is a composite layer including a tunneling layer, a storage layer (also known as a "charge trap layer"), and a blocking layer. The remaining space of the channel hole of channel structure 112 can be partially or fully filled with a capping layer 118 including dielectric materials, such as silicon oxide. Channel structure 112 can have a cylinder shape (e.g., a pillar shape). Capping layer 118, semiconductor channel 114, the tunneling layer, the storage layer, and the blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 116 can include a composite layer of silicon oxide/silicon oxynitride (or silicon nitride)/silicon oxide (ONO).

In some embodiments, conductive layer 106 in memory stack 110 functions as a gate electrode/gate conductor/gate line of memory cells in memory string 104. Conductive layer 106 can include multiple control gates of multiple NAND memory cells and can extend laterally as a word line ending at the edge of memory stack 110 (e.g., in a staircase structure of memory stack 110). In some embodiments, the word lines extend in the x-direction perpendicular to both the y-direction and z-direction. The bit lines extend in the y-direction perpendicular to both the x-direction and z-direction. In some embodiments, memory cell transistors in memory string 104 include gate conductors (e.g., parts of conductive layers 106 that abut channel structure 112) made from tungsten, adhesion layers (not shown) including titanium/titanium nitride (Ti/TiN) or tantalum/tantalum nitride (Ta/TaN), gate dielectric layers (not shown) made from high-k dielectric materials, and channel structure 112.

In some embodiments, memory string 104 further includes a semiconductor plug 120 in the lower portion (e.g., at the lower end) of memory string 104. As used herein, the "upper end" of a component (e.g., memory string 104) is the end farther away from substrate 102 in the z-direction, and the "lower end" of the component (e.g., memory string 104) is the end closer to substrate 102 in the z-direction when substrate 102 is positioned in the lowest plane of 3D memory device 100. Semiconductor plug 120 can include a semiconductor material, such as silicon, which is epitaxially grown from substrate 102 in any suitable directions. It is understood that in some embodiments, semiconductor plug 120 includes single crystalline silicon, the same material of substrate 102. In other words, semiconductor plug 120 can include an epitaxially-grown semiconductor layer that is the same as the material of substrate 102. In some embodiments, part of semiconductor plug 120 is over the top surface of substrate 102 and in contact with semiconductor channel 114. Semiconductor plug 120 can function as a channel controlled by a source select gate of memory string 104.

In some embodiments, memory string 104 further includes a channel plug 122 in the upper portion (e.g., at the upper end) of memory string 104. Channel plug 122 can be in contact with the upper end of semiconductor channel 114. Channel plug 122 can include semiconductor materials (e.g., polysilicon) or conductive materials (e.g., metals). In some embodiments, channel plug 122 includes an opening filled with Ti/TiN or Ta/TaN as an adhesion layer and tungsten as a conductor layer. By covering the upper end of channel structure 112 during the fabrication of 3D memory device 100, channel plug 122 can function as an etch stop layer to prevent etching of dielectrics filled in channel structure 112, such as silicon oxide and silicon nitride. In some embodiments, channel plug 122 also functions as the drain of memory string 104.

In some embodiments, 3D memory device 100 further includes contact hole structures 124. Each contact hole structure 124 can extend vertically through memory stack 110. In some embodiments, contact hole structure 124 includes a contact hole filled with conductive materials as a contact 126. Contact hole structure 124 can further include a spacer 128 made of any suitable dielectric materials (e.g., silicon oxide) between contact 126 and memory stack 110 to electrically separate surrounding conductive layers 106 in memory stack 110 from contact 126. As a result, contact hole structures 124 can laterally separate 3D memory device 100 into multiple memory regions, such as memory blocks. In some embodiments, contact hole structure 124 functions as the source contact for NAND memory strings 104 in the same memory region (e.g., memory block) sharing the same ACS. Contact hole structure 124 can thus be referred to as a common source contact of multiple NAND memory strings 104. In some embodiments, substrate 102 includes a doped region 130 as the common source of a plurality of memory strings 104 surrounding contact hole structure 124. The lower end of contact hole structure 124 may be in contact with the doped region of substrate 102. Contact 126 of contact hole structure 124 thus can electrically connect to channel structures 112 of NAND memory strings 104 through doped region/common source 130.

As described below in detail, due to the limitations of etching process (e.g., deep reactive ion etch (DRIE)) for forming the contact hole, in particular when the levels of memory stack 110 continue to increase, the sidewall profile of the contact hole is not straight up as shown in FIG. 1B, but rather being tilted. In some embodiments, the lateral dimension of the contact hole (and contact hole structure 124) decreases from top to bottom. That is, the lateral dimension of contact hole structures 124 in its upper portion can be greater than the lateral dimension in its lower portion.

FIGS. 2A-2L illustrate an exemplary fabrication process for forming a 3D memory device, according to some embodiments of the present disclosure. FIG. 3 illustrates a flowchart of an exemplary method 300 for forming a 3D memory device, according to some embodiments of the present disclosure. FIG. 4 illustrates a flowchart of another exemplary method 400 for forming a 3D memory device, according to some embodiments of the present disclosure. Examples of the 3D memory device depicted in FIGS. 2A-2L and 3-4 include 3D memory device 100 depicted in FIGS. 1A and 1B. FIGS. 2A-2L and 3-4 will be described together. It is understood that the operations shown in methods 300 and 400 are not exhaustive and that other operations can be performed as well before, after, or between any of the illustrated operations. Further, some of the operations may be performed simultaneously, or in a different order than shown in FIGS. 3-4.

Referring to FIG. 3, method 300 starts at operation 302, in which a dielectric stack is formed over a substrate. The substrate can be a silicon substrate. The dielectric stack can include interleaved sacrificial layers and dielectric layers. In the example of method 400 in FIG. 4, at operation 402, interleaved sacrificial layers and dielectric layers are alternatingly deposited over a substrate.

Figure 2A:
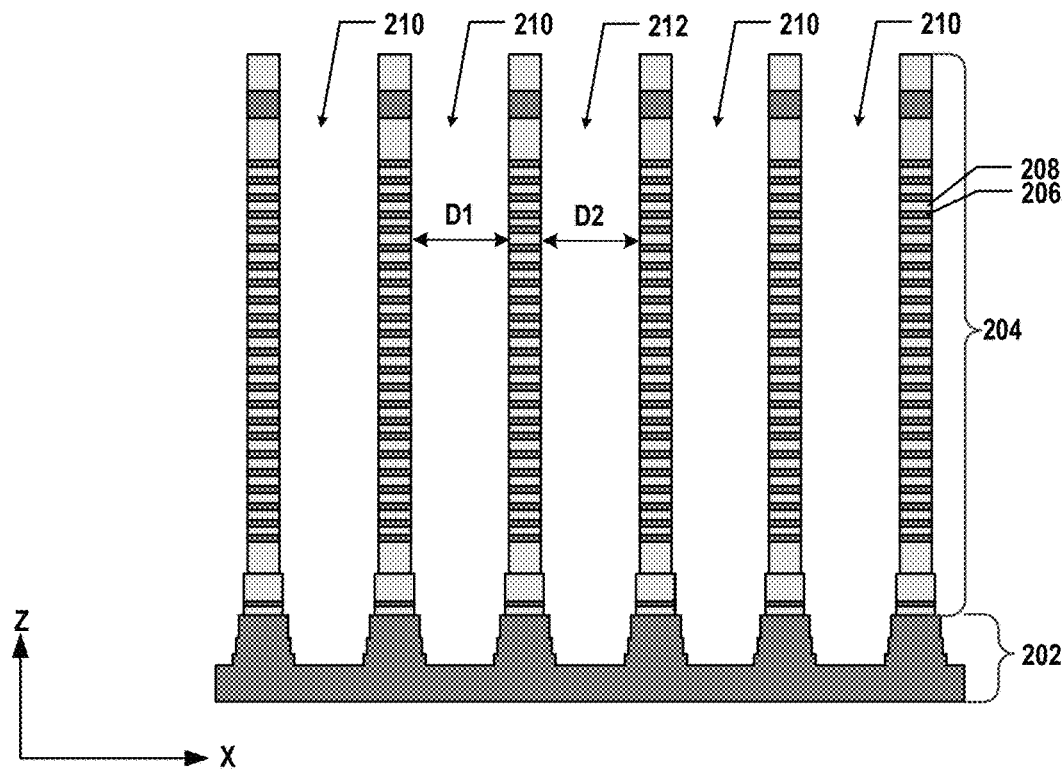
FIGS. 2A-2L illustrate an exemplary fabrication process for forming a 3D memory device, according to some embodiments of the present disclosure.

Referring to FIG. 2A, a dielectric stack 204 including a plurality pairs of a first dielectric layer (also known as a "sacrificial layer" 206) and a second dielectric layer 208 (together referred to herein as "dielectric layer pairs") are formed over a silicon substrate 202. That is, dielectric stack 204 includes interleaved sacrificial layers 206 and dielectric layers 208, according to some embodiments. Dielectric layers 208 and sacrificial layers 206 can be alternatingly deposited on silicon substrate 202 to form dielectric stack 204. In some embodiments, each dielectric layer 208 includes a layer of silicon oxide, and each sacrificial layer 206 includes a layer of silicon nitride. Dielectric stack 204 can be formed by one or more thin film deposition processes including, but not limited to, chemical vapor deposition (CVD), physical vapor deposition (PVD), atomic layer deposition (ALD), or any combination thereof. In some embodiments, an insulation layer (not shown) is formed between silicon substrate 202 and dielectric stack 204 by depositing dielectric materials, such as silicon oxide, on silicon substrate 202.

Method 300 proceeds to operation 304, as illustrated in FIG. 3, in which a plurality of channel holes and a plurality of contact holes are formed through the dielectric stack. In the example of method 400 in FIG. 4, at operation 404, a plurality of channel holes and a plurality of contact holes are formed through the interleaved sacrificial layers and dielectric layers. The plurality of channel holes and a plurality of contact holes can be simultaneously formed through the dielectric stack by, e.g., performing an anisotropic etching process to remove portions of dielectric stack using an etch mask. The plurality of contact holes are formed in an array that includes a plurality of contact rows extending along the x-direction in the plan view. At least one contact hole can be surrounded by a plurality of channel holes of nominally same lateral distances.

As illustrated in FIG. 2A, a plurality of channel holes 210 and contact holes 212 are simultaneously formed through dielectric stack 204. In some embodiments, an etching mask (not shown) is patterned on dielectric stack 204 by photolithography, development, and etching. The etching mask can be a photoresist mask or a hard mask patterned based on a photolithography mask. The photolithography mask and/or etching mask can have patterns of channel holes 210 and contact holes 212 thereon as shown in the example of FIG. 2A above. In some embodiments, the etching mask includes an array of first openings for forming channel holes 210 and second openings for forming contact holes 212. The first openings and the second openings may have nominally same lateral dimensions (e.g., diameters). In some embodiments, channel holes 210 and contact holes 212 have nominally same lateral dimensions (e.g., diameters).

As illustrated in FIG. 2A, parts of dielectric stack 204 are etched through by one or more wet etching and/or dry etching processes, such as DRIE, using the patterned etching mask to simultaneously form channel holes 210 and contact holes 212 in a pattern defined by the photolithography mask and/or etching mask. In some embodiments, channel holes 210 and contact holes 212 extend vertically further into the upper portion of silicon substrate 202. The etching process through dielectric stack 204 may not stop at the top surface of silicon substrate 202 and may continue to etch part of silicon substrate 202. In some embodiments, a separate etching process is used to etch part of silicon substrate 202 after etching through dielectric stack 204. In some embodiments, the lateral dimensions (e.g., diameter D1) of channel hole 210 are nominally the same as the lateral dimensions (e.g., diameter D2) of contact hole 212.

Method 300 proceeds to operation 306, as illustrated in FIG. 3, in which a channel structure is formed in each of the channel holes. In the example of method 400 in FIG. 4, at operation 406, a sealing layer is formed in each of the contact holes. In some embodiments, a semiconductor plug is formed in the lower portion of each of the channel holes, and a channel plug is formed in the upper portion of each of the channel holes.

Figure 2B:
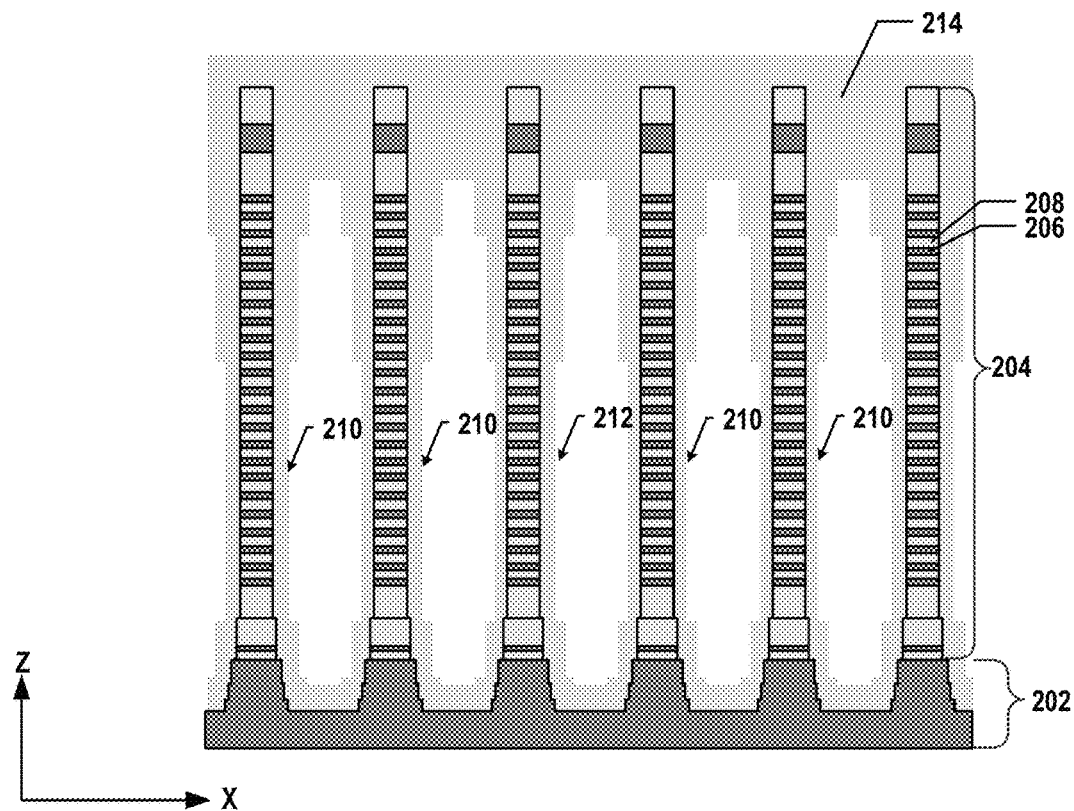

As illustrated in FIG. 2B, a sealing layer 214 is formed to fill in and cover channel holes 210 and contact holes 212. Sealing layer 214 can be formed by depositing a sacrificial layer, such as polysilicon, which is to be later removed, to partially fill in and cover channel holes 210 and contact holes 212 using one or more thin film deposition processes including ALD, CVD, PVD, any other suitable processes, or any combination thereof. In some embodiments, sealing layer 214 is formed by a rapid-sealing deposition process.

Figure 2C:
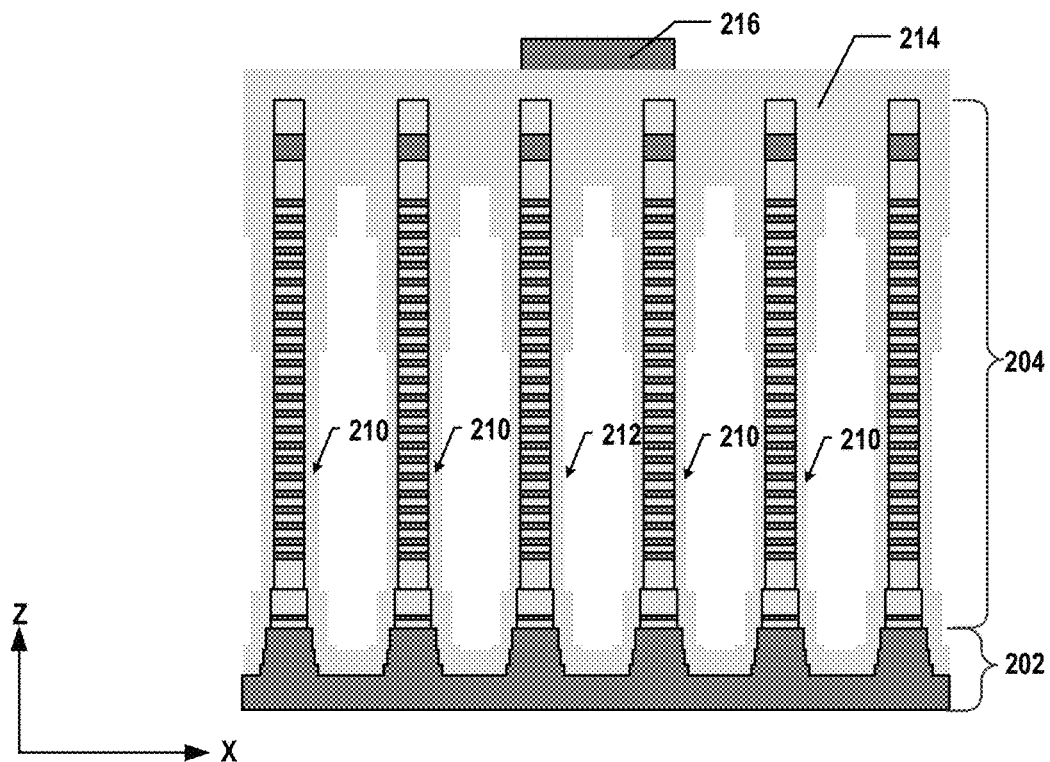
Figure 2D:
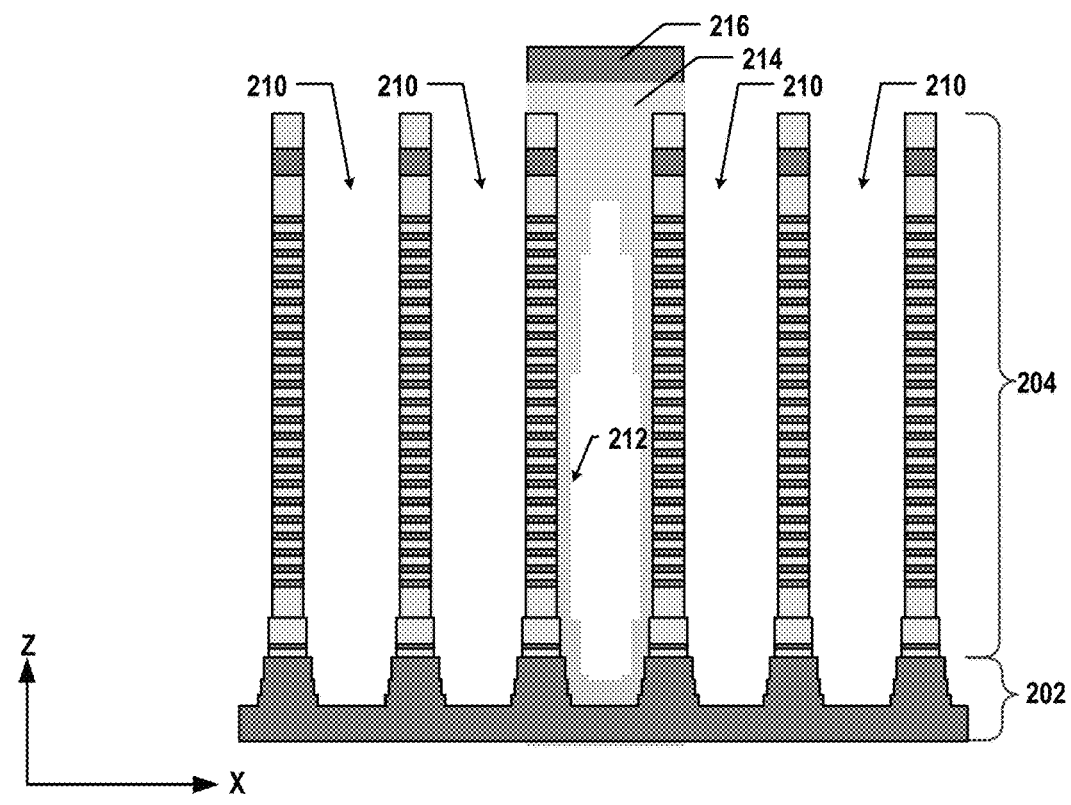

After sealing layer 214 is formed, channel holes 210 are re-opened. As illustrated in FIG. 2C, a photoresist layer 216 (as a channel hole re-open mask) is patterned to cover part of sealing layer 214 right above contact hole 212 using photolithography and development processes. As illustrated in FIG. 2D, parts of sealing layer 214 right above channel holes 210 are removed using wet etching and/or dry etching processes since they are not covered by photoresist layer 216, leaving sealing layer 214 to fill in and cover only contact hole 212. Channel holes 210 are thereby re-opened for later processes.

Figure 2E:
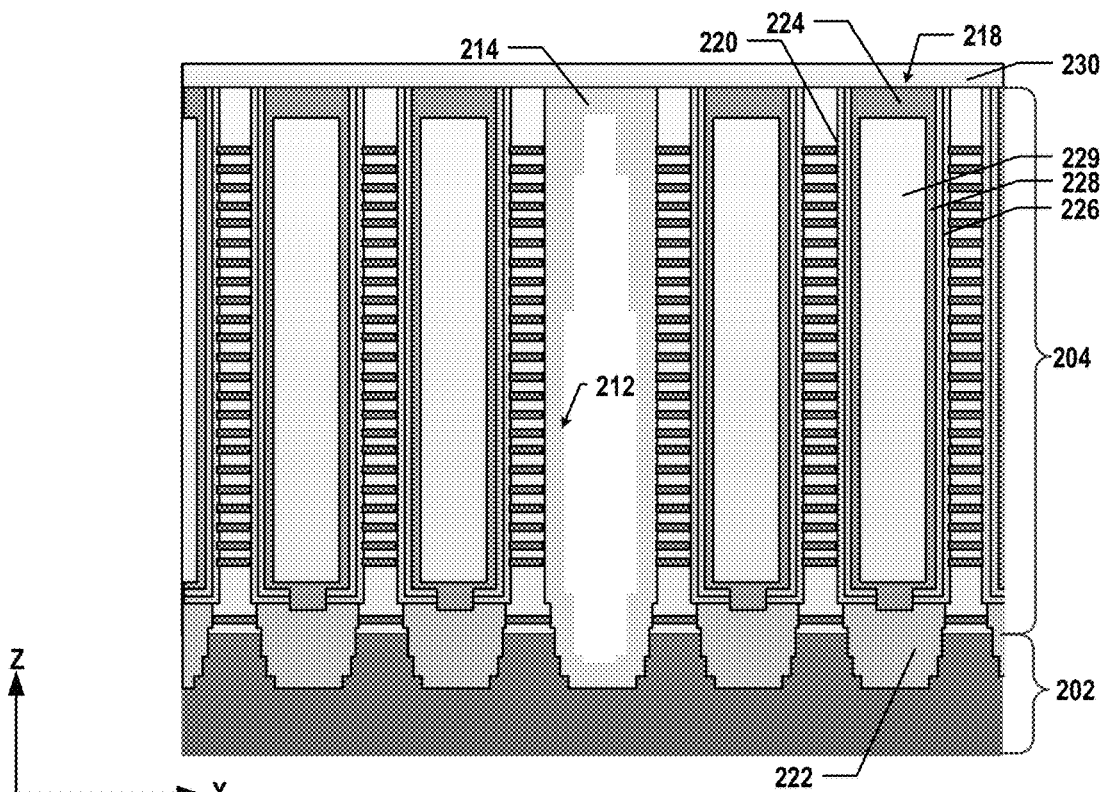

As illustrated in FIG. 2E, a semiconductor plug 222 is formed by filling the lower portion of channel hole 210 (shown in FIG. 2D) with a semiconductor material (e.g., single crystalline silicon epitaxially grown from silicon substrate 202 or polysilicon deposited over substrate 202) in any suitable directions (e.g., from bottom surface and/or side surface). The fabrication processes for epitaxially growing semiconductor plug 222 can include, but not limited to, vapor-phase epitaxy (VPE), liquid-phase epitaxy (LPE), molecular-beam epitaxy (MBE), or any combinations thereof.

As illustrated in FIG. 2E, a channel structure 220 is formed above semiconductor plug 222 in channel hole 210. Channel structure 220 can include a memory film 226 (e.g., including a blocking layer, a storage layer, and a tunneling layer) and a semiconductor channel 228 formed above semiconductor plug 222. In some embodiments, memory film 226 is first deposited along the sidewall and bottom surface of channel hole 210, and semiconductor channel 228 is then deposited over memory film 226 and above semiconductor plug 222. The blocking layer, storage layer, and tunneling layer can be sequentially deposited in this order using one or more thin film deposition processes, such as ALD, CVD, PVD, any other suitable processes, or any combination thereof, to form memory film 226. Semiconductor channel 228 can then be deposited on the tunneling layer using one or more thin film deposition processes, such as ALD, CVD, PVD, any other suitable processes, or any combination thereof. In some embodiments, a capping layer 229 is filled in the remaining space of channel hole 210 by depositing dielectric materials after the deposition of semiconductor channel 228, such as silicon oxide.

As illustrated in FIG. 2E, a channel plug 224 is formed in the upper portion of channel hole 210. In some embodiments, parts of memory film 226, semiconductor channel 228, and capping layer 229 on the top surface of dielectric stack 204 and in the upper portion of channel hole 210 can be removed by CMP, grinding, wet etching, and/or dry etching to form a recess in the upper portion of channel hole 210. Channel plug 224 then can be formed by depositing conductive materials, such as metals, into the recess by one or more thin film deposition processes, such as CVD, PVD, ALD, electroplating, electroless plating, or any combination thereof. A memory string 218 (e.g., a NAND memory strings) is thereby formed. In some embodiments, an insulation layer 230 including dielectric materials, such as silicon oxide, is formed on dielectric stack 204 after the formation of channel structures 220 of memory strings 218.

Figure 2F:
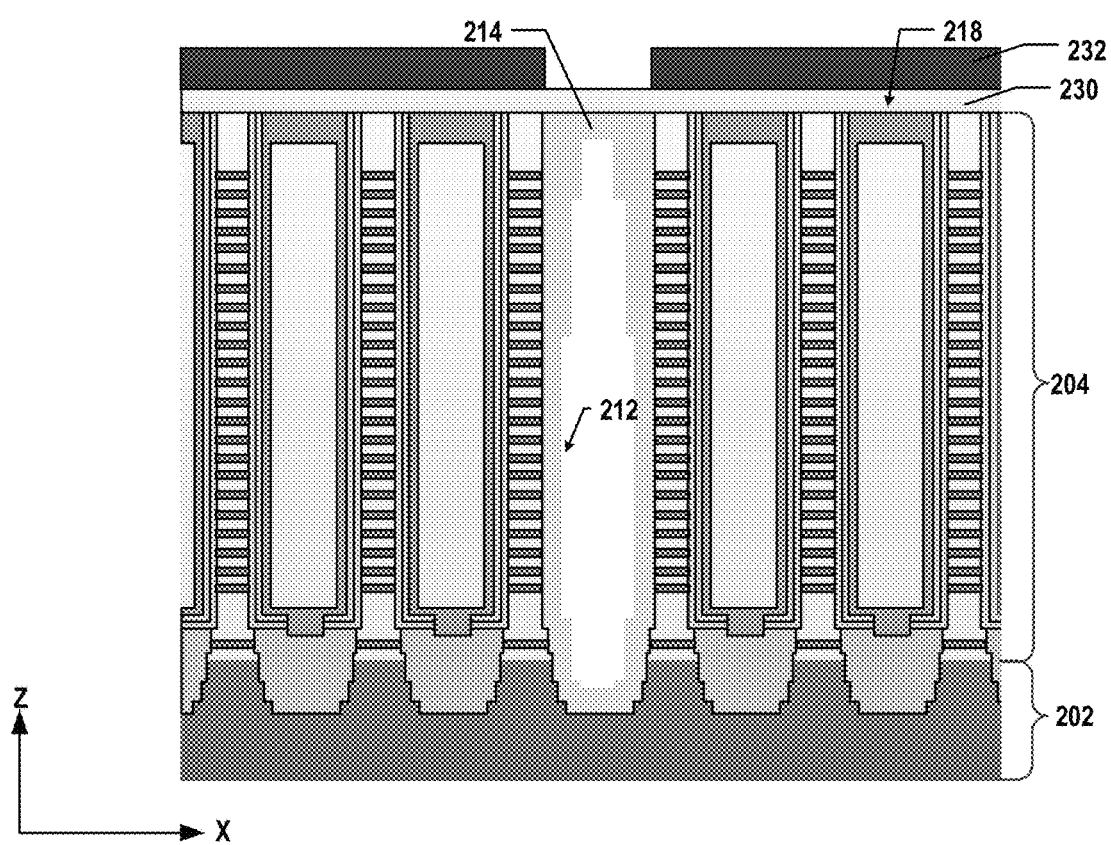
Figure 2G:
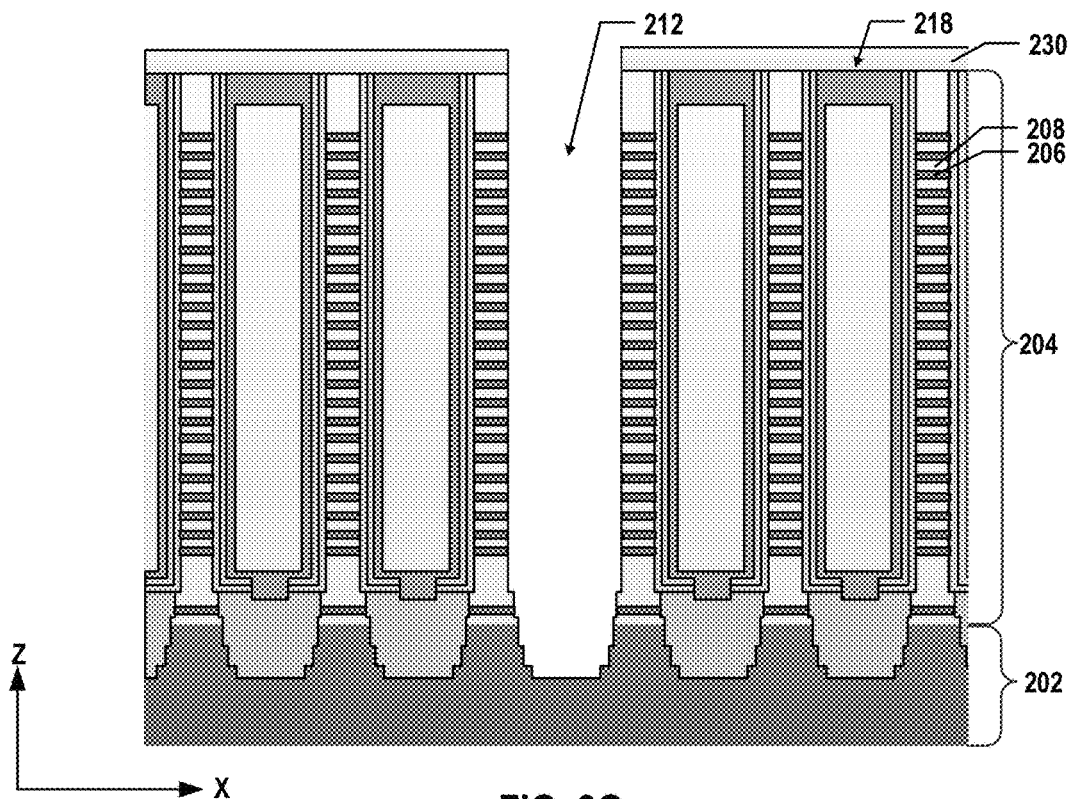

Method 400 proceeds to operation 408, as illustrated in FIG. 4, in which the sealing layer is removed from each of the contact holes after the formation of channel structures in channel holes. As illustrated in FIG. 2F, a photoresist layer 232 (as a contact hole re-open mask) is patterned to cover parts of insulation layer 230 right above memory strings 218 using photolithography and development processes. As illustrated in FIG. 2G, part of insulation layer 230 right above contact hole 212 and sealing layer 214 that fills in and covers contact hole 212 (shown in FIG. 2F) are removed using wet etching and/or dry etching processes since they are not covered by photoresist layer 232 (shown in FIG. 2F). Contact holes 212 are thereby re-opened for later processes.

Method 300 proceeds to operation 308, as illustrated in FIG. 3, in which a memory stack including interleaved conductive layers and dielectric layers is formed. In the example of method 400 in FIG. 4, at operation 410, a plurality of conductive layers is formed through the contact holes. In some embodiments, forming the memory stack includes etching the sacrificial layers in the dielectric stack, and depositing the conductive layers of the memory stack through the contact holes.

Figure 2H:
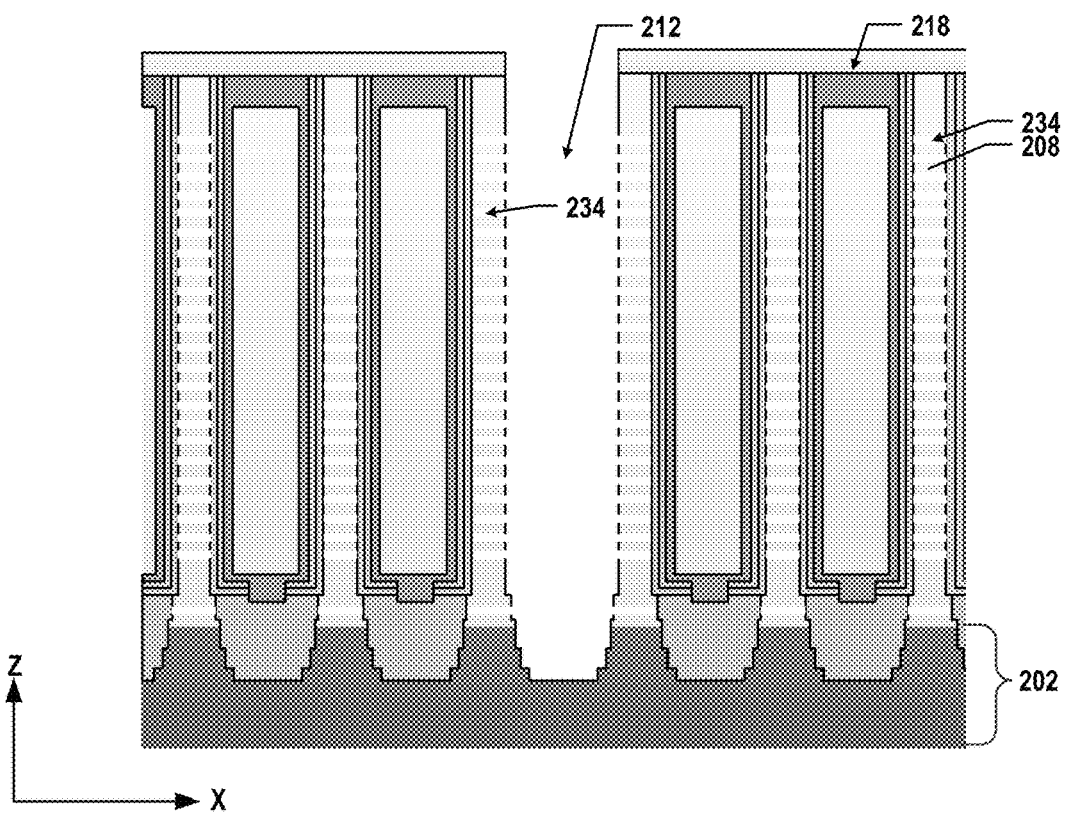

As illustrated in FIG. 2H, sacrificial layers 206 (shown in FIG. 2G) in dielectric stack 204 are removed by wet etching and/or dry etching selective to dielectric layers 208. Lateral recesses 234 connected to contact hole 212 can be formed after sacrificial layers 206 are completely etched away. In some embodiments, the etching process is facilitated by exposing contact hole 212 to hot phosphoric acid by which silicon nitride in sacrificial layers 206 is etched preferentially over silicon oxide in dielectric layers 208.

Figure 2I:
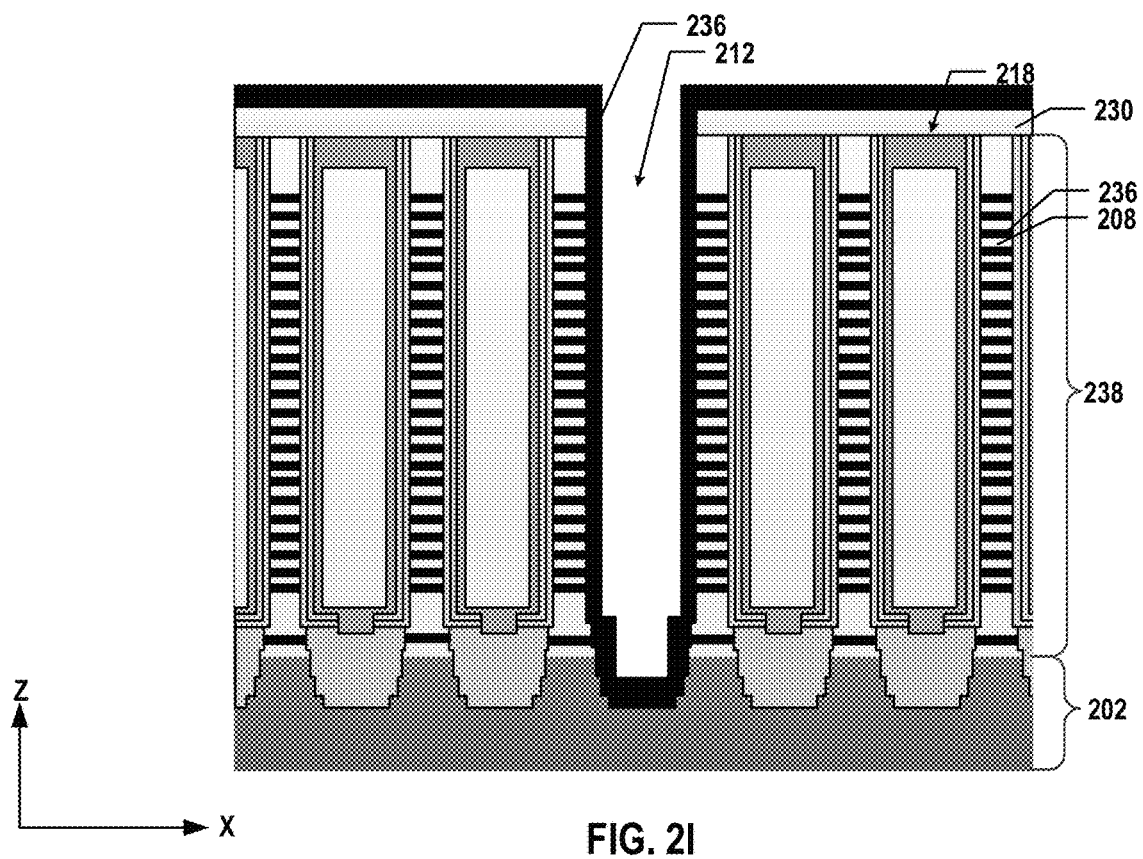

As illustrated in FIG. 2I, conductive layers 236 are formed along the sidewall of contact hole 212 and filling in lateral recesses 234 (shown in FIG. 2H). In some embodiments, conductive layer 236 is a composite layer including an adhesion layer and a conductor layer (e.g., a gate conductor/gate line). In some embodiments, a gate dielectric layer (not shown) is deposited prior to the deposition of conductive layer 236. The gate dielectric layer and conductive layer 236 can be formed by one or more thin film deposition processes, such as ALD, CVD, PVD, any other suitable processes, or any combination thereof. The gate dielectric layer can include dielectric materials including silicon nitride, high-k dielectrics, or any combination thereof. Conductive layer 236 can include conductive materials including, but not limited to, W, Co, Cu, Al, polysilicon, silicides, or any combination thereof. In some embodiments, the gate dielectric layer, adhesion layer, and conductor layer are each formed by CVD processes in which the reaction gases pass through contact hole 212 to lateral recesses 234 and are reacted and deposited along the sidewalls of contact hole 212 and lateral recesses 234. Conductive layers 236 thereby replace sacrificial layers 206 to transfer dielectric stack 204 into a memory stack 238.

Figure 2J:
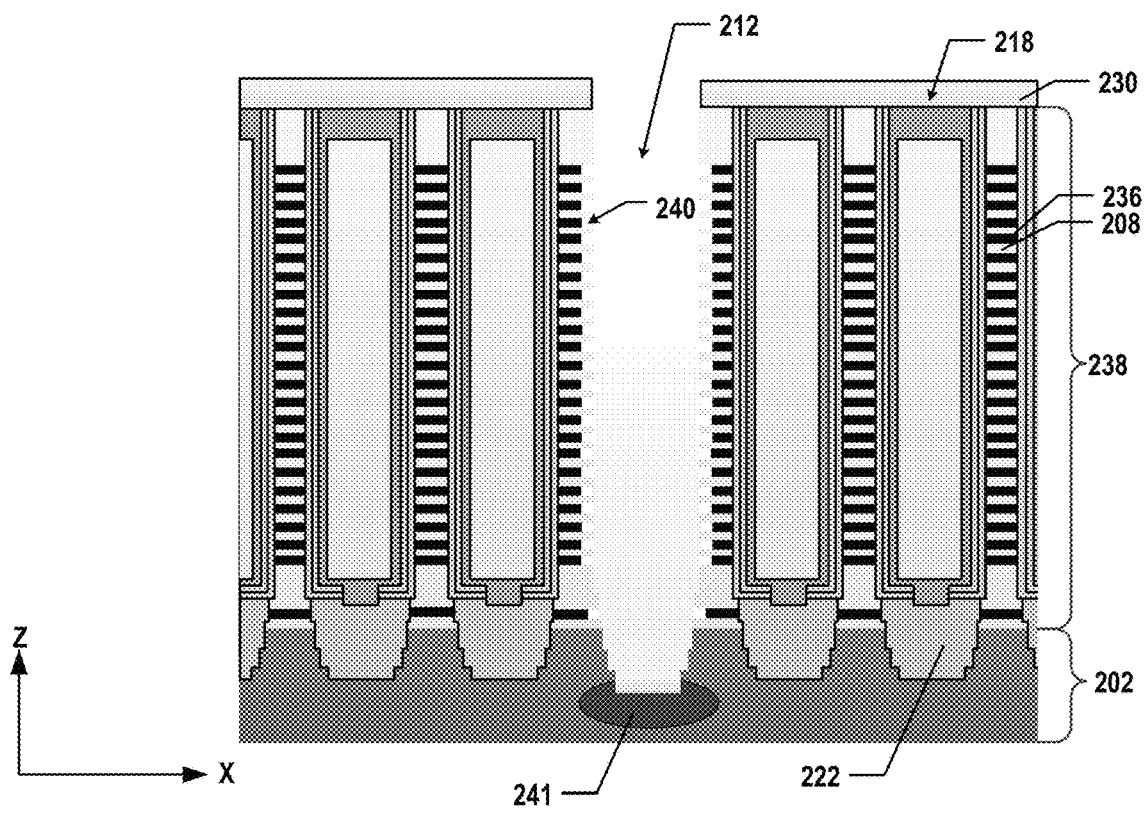

As illustrated in FIG. 2J, recesses 240 abutting the sidewall of contact hole 212 are formed by etching parts of conductive layers 236 of memory stack 238 that abut the sidewall of contact hole 212. In some embodiments, recesses 240 are formed by applying etchants to conductive layers 236 through contact hole 212 to completely remove the part of conductive layer 236 along the sidewall of contact hole 212 and further etch parts of conductive layers 236 in lateral recesses 234 (shown in FIG. 2H). The dimension of recess 240 can be controlled by the etching rate (e.g., based on the etchant temperature and concentration) and/or etching time.

In some embodiments, a doped region 241, subsequently functioning as a common source of the surrounded memory strings 218 may be formed in substrate 202 at a bottom of contact hole 212 by a suitable ion implantation process. In some embodiments, doped region 241 is electrically connected to memory strings 218 through semiconductor plugs 222.

Figure 2K:
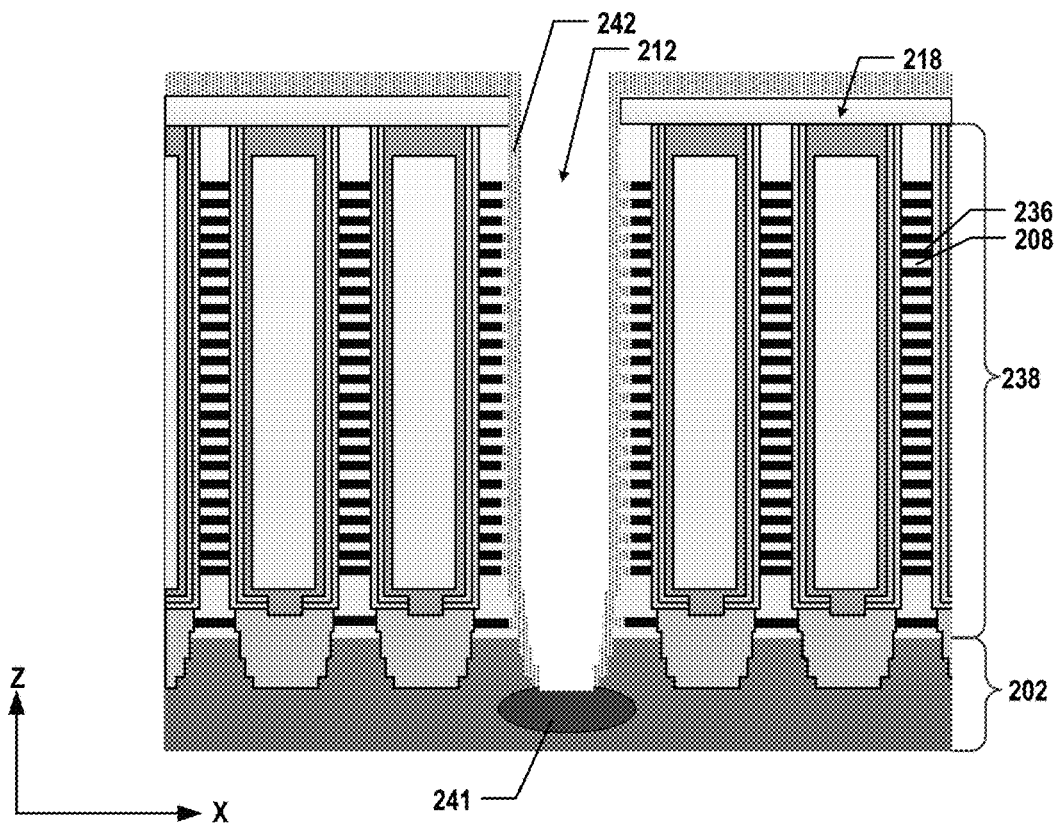

Method 300 proceeds to operation 310, as illustrated in FIG. 3, in which a spacer is formed along a sidewall of the contact hole to cover the conductive layers and electrically separate the conductive layers of the memory stack from a contact later formed in the contact hole. In the example of FIG. 4, at operation 412, a spacer is deposited along the sidewall of each of the contact holes. As illustrated in FIG. 2K, a spacer 242 is formed along the sidewall of contact hole 212 and in recesses 240 (shown in FIG. 2J) using one or more thin film deposition processes, such as ALD, CVD, PVD, any other suitable processes, or any combination thereof. Spacer 242 can include a single or composite layer of dielectric materials, such as silicon oxide and silicon nitride. By covering the sidewall of the contact hole as well as filling in recesses 240 with spacer 242, conductive layers 236 (e.g., gate lines) of memory stack 238 can be electrically separated from a contact later formed in contact hole 212 by spacer 242.

Figure 2L:
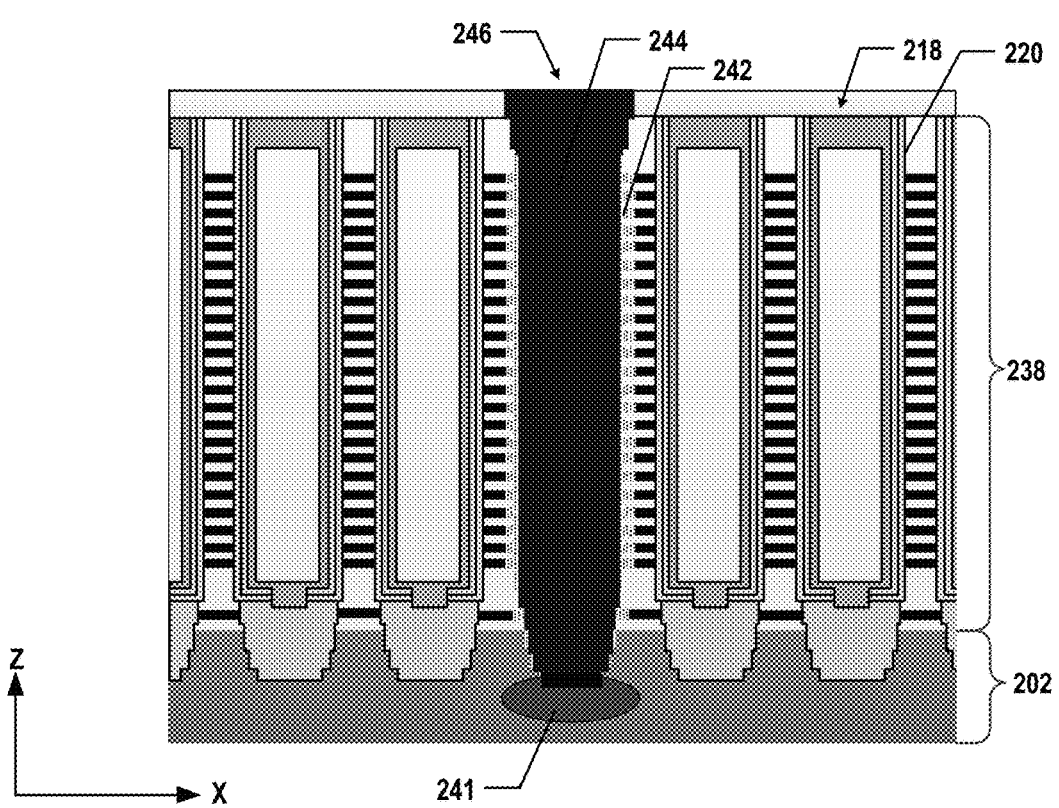

Method 300 proceeds to operation 312, as illustrated in FIG. 3, in which a contact is formed over the spacer in the contact hole. In the example of method 400 in FIG. 4, at operation 414, a contact is formed over the spacer in the contact hole. The contact is electrically connected to the channel structure through the doped region in the substrate. The contact can be deposited over the spacer in each of the contact holes. As illustrated in FIG. 2L, a contact 244 is formed over spacer 242 in contact hole 212 (shown in FIG. 2K). Contact 244 can be formed by depositing conductive materials including, not limited to, W, Co, Cu, Al, polysilicon, silicides, or any combination thereof, over spacer 242 in the contact hole using one or more thin film deposition processes, such as ALD, CVD, PVD, any other suitable processes, or any combination thereof. A contact hole structure 246 including spacer 242 and contact 244 is thereby formed in the contact hole, surrounded by a plurality of memory strings 218 (e.g., channel structures 220). Contact 244 can act as an ACS contact electrically connected to channel structures 220 of memory strings 218 surrounding the respective contact hole structure (e.g., contact hole structure 246).

In some embodiments, a 3D memory device includes a substrate, a memory stack with interleaved conductive layers and dielectric layers over the substrate, an array of channel structures each extending vertically through the memory stack, and a plurality of contact hole structures each extending vertically through the memory stack and electrically connected to a common source of one or more of the channel structures. At least one of the plurality of contact hole structures may be surrounded by a plurality of the channel structures of nominally equal lateral distances to the respective contact hole structure.

In some embodiments, the plurality of channel structures are located adjacent to the respective contact hole structure.

In some embodiments, in a plan view, the plurality of contact hole structures are arranged in a contact row that extends along a lateral direction. The contact row is parallel to a plurality of rows of the channel structures.

In some embodiments, the plurality of contact hole structures is aligned with at least one of the channel structures along the contact row, at least two of the plurality of contact hole structures are separated from each other by the at least one of the channel structures in between.

In some embodiments, each one of the plurality of contact hole structures is separated from one another by at least two of the channel structures in between.

In some embodiments, each one of the plurality of contact hole structure is surrounded by a set of at least six of the channel structures of nominally equal lateral distances to the respective contact hole structure. The set of at least six of the channel structures may have two of the channel structures aligned in the contact row and adjacent to the respective contact hole structure and at least four of the channel structures outside the contact row.

In some embodiments, the at least four of the channel structures are located in one or more rows of the channel structures adjacent to the contact row.

In some embodiments, the 3D memory device further includes an insulating structure extending vertically through the array of channel structures and laterally along a boundary of the array of channel structures.

In some embodiments, the insulating structures includes a dielectric material.

In some embodiments, the plurality of contact hole structures are further arranged in a second contact row in parallel with the contact row.

In some embodiments, at least one row of the channel structures is positioned between any two of the contact row, the second contact row, and an insulating structure.

In some embodiments, at least two rows of channel structures are located between the contact row and the second contact row, and between one of the contact row and the second contact row and the insulating structure.

In some embodiments, the 3D memory device further includes a TSG cut extending vertically through part of the memory stack and laterally along the lateral direction, wherein at least one of the contact row and the second contact row overlaps with the TSG in the plan view.

In some embodiments, in the plane view, each of the plurality of contact hole structures is spaced apart from an adjacent contact hole structure by a same lateral distance in each of the first contact row and the second contact row.

In some embodiments, in the plan view, the first contact row and the second contact row are spaced apart by another lateral distance that is nominally equal to the lateral distance.

In some embodiments, in the plan view, the plurality of contact hole structures is arranged in an array.

In some embodiments, each of the plurality of contact hole structures is electrically connected to a common source of the respective plurality of the channel structures surrounding that contact hole structure In some embodiments, the plurality of contact hole structures includes a conductive material.

In some embodiments, a diameter of each of the plurality of channel structures and a diameter of each of the plurality of contact hole structures are nominally the same.

In some embodiments, a 3D memory device includes a substrate, a memory stack with interleaved conductive layers and dielectric layers over the substrate, an array of channel structures each extending vertically through the memory stack, and an insulating structure extending vertically through the array of channel structures and laterally along a boundary of the array of channel structures. The 3D memory device may also include a plurality of contact hole structures each extending vertically through the memory stack and electrically connected to a common source of one or more of the channel structures. Each of the plurality of contact hole structures may be surrounded by a plurality of the channel structures.

In some embodiments, each of the plurality of contact hole structures is surrounded by a same number of the plurality of channel structures having nominally equal lateral distances to the respective contact hole structure. The respective contact hole structure may be electrically connected to a common source of the respective plurality of the channel structures surrounding that contact hole structure.

In some embodiments, the plurality of the channel structures are located adjacent to the respective contact hole structure.

In some embodiments, in a plan view, the plurality of contact hole structures are arranged in an array.

In some embodiments, the insulating structure comprises a dielectric material, and the plurality of contact hole structures each comprises a conductive material.

In some embodiments, a method for forming a 3D memory device includes the following operations. First, a dielectric stack comprising interleaved sacrificial layers and dielectric layers is formed over a substrate. A plurality of channel holes and a plurality of contact holes are formed through the dielectric stack. The plurality of contact holes extend vertically into the substrate and are each surrounded by a plurality of channel holes of nominally equal lateral distances to the respective contact hole in a plan view. A channel structure is formed in each of the plurality of channel holes. Then, a memory stack having interleaved conductive layers and dielectric layers is formed by replacing, through the contact holes, the sacrificial layers in the dielectric stack with the conductive layers. A spacer is formed along a sidewall of each of the plurality of contact holes to cover the conductive layers of the memory stack. A contact is formed over the spacer in each of the plurality of contact holes. The contact may be electrically connected to a common source of the plurality of channel structures.

In some embodiments, forming the plurality of channel holes and the plurality of contact holes includes performing a patterning process to simultaneously form the plurality of channel holes and the plurality of contact holes through the dielectric stack.

In some embodiments, the plurality of channel holes and the plurality of contact holes includes forming the plurality of contact holes aligned in a contact row along a lateral direction. At least two of the plurality of contact holes are separated by a channel hole in between along the lateral direction.

In some embodiments, the method further includes forming a sealing layer in each of the contact holes prior to forming the plurality of channel structures, and removing the sealing layer from each of the contact holes after forming the plurality of channel structures.

In some embodiments, replacing, through the contact holes, the sacrificial layers in the dielectric stack with the conductive layers includes removing the sacrificial layers in the dielectric stack through each of the contact holes after forming the plurality of channel structures to form a plurality of lateral recesses of the nominally equal lateral distances to channel structures formed from the plurality of respective surrounding channel holes, and depositing a conductive material to fill up the plurality of lateral recesses.

In some embodiments, the method further includes forming a plurality of recesses abutting the sidewall of each of the contact holes after forming the memory stack and prior to forming the spacer.

In some embodiments, forming the plurality of recesses includes etching parts of the conductive layers in the memory stack that abut the sidewall of the contact hole.

In some embodiments, the method further includes forming an insulating structure extending along a boundary of the plurality of contact holes and the plurality of channel holes. Forming the insulating structure may include forming a trench extending vertically through one of the dielectric stack and the memory stack and laterally along the boundary of the plurality of contact holes and the plurality of channel holes, and depositing a dielectric material to fill up the trench.

In some embodiments, a method for forming a 3D memory device includes the following operations. First, interleaved sacrificial layers and dielectric layers are alternatively deposited over a substrate. The interleaved sacrificial layers and dielectric layers may be etched through simultaneously to form a plurality of channel holes and a plurality of contact holes. The plurality of contact holes may be aligned with a portion of the plurality of channel holes in a contact row along a lateral direction in a plan view. A sealing layer may be deposited in each of the plurality of contact holes, and the sealing layer in each of the contact holes may be etched away after depositing a channel structure in each of the plurality of channel holes. Through the contact holes, the sacrificial layers may be replaced with a plurality of conductive layers. A spacer may be deposited along a sidewall of each of the contact holes.

In some embodiments, the method further includes depositing a contact over the spacer in each of the plurality of contact holes.

In some embodiments, the method further includes, prior to etching through the interleaved sacrificial layers and dielectric layers, patterning an etching mask on the interleaved sacrificial layers and dielectric layers. The etching mask may include a plurality of first openings corresponding to the plurality of channel holes and a plurality of second openings corresponding to the plurality of contact holes.

In some embodiments, depositing a sealing layer in each of the plurality of contact holes includes performing a rapid-sealing deposition process to deposit a sealing material in the plurality of contact holes and the plurality of channel holes, and removing a portion of the sealing layer in each of the plurality of channel holes to expose the substrate and retain the sealing layer in each of the plurality of contact holes.

In some embodiments, the method further includes, after depositing the sealing layer, subsequently depositing a memory film and a semiconductor channel along a sidewall of each of the plurality of channel holes to form the channel structure in each of the plurality of channel holes.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;
   a memory stack comprising interleaved conductive layers and dielectric layers over the substrate;
   an array of channel structures each extending vertically through the memory stack;
   a plurality of contact hole structures each extending vertically through the memory stack and electrically connected to a common source of one or more of the channel structures, at least one of the plurality of contact hole structures being surrounded by a plurality of the channel structures of nominally equal lateral distances to the respective contact hole structure; and
   a top select gate (TSG) cut extending vertically through part of the memory stack and laterally along a first lateral direction, wherein at least two contact hole structures of the plurality of contact hole structures are disposed in the TSG cut and are separated by at least two channel structures also disposed in the TSG cut.

2. The 3D memory device of claim 1, wherein the plurality of channel structures are located adjacent to the respective contact hole structure.

3. The 3D memory device of claim 2, wherein in a plan view, the plurality of contact hole structures are arranged in a contact row that extends along a lateral direction, the contact row being parallel to a plurality of rows of the channel structures.

4. The 3D memory device of claim 3, wherein the plurality of contact hole structures is aligned with at least one of the channel structures along the contact row, at least two of the plurality of contact hole structures being separated from each other by the at least one of the channel structures in between.

5. The 3D memory device of claim 4, wherein each one of the plurality of contact hole structures is separated from one another by at least two of the channel structures in between.

6. The 3D memory device of claim 5, wherein each one of the plurality of contact hole structure is surrounded by a set of at least six of the channel structures of nominally equal lateral distances to the respective contact hole structure, the set of at least six of the channel structures comprising two of the channel structures aligned in the contact row and adjacent to the respective contact hole structure and at least four of the channel structures outside the contact row.

7. The 3D memory device of claim 6, wherein the at least four of the channel structures are located in one or more rows of the channel structures adjacent to the contact row.

8. The 3D memory device of claim 1, further comprising an insulating structure extending vertically through the array of channel structures and laterally along a boundary of the array of channel structures, the insulating structure comprising a dielectric material.

9. The 3D memory device of claim 8, wherein in a plan view, the plurality of contact hole structures are arranged in a contact row that extends along a lateral direction, the contact row being parallel to a plurality of rows of the channel structures;
   the plurality of contact hole structures are further arranged in a second contact row in parallel with the contact row; and
   at least one row of the channel structures is positioned between any two of the contact row, the second contact row, and an insulating structure.

10. The 3D memory device of claim 9, wherein at least two rows of channel structures are located between the contact row and the second contact row, and between one of the contact row and the second contact row and the insulating structure.

11. The 3D memory device of claim 10, wherein at least one of the contact row and the second contact row overlaps with the TSG in the plan view.

12. The 3D memory device of claim 1, wherein each of the plurality of contact hole structures is electrically connected to a common source of the respective plurality of the channel structures surrounding that contact hole structure; and a diameter of each of the plurality of channel structures and a diameter of each of the plurality of contact hole structures are nominally the same.

13. The 3D memory device of claim 1, wherein each of the at least two contact hole structures is separated from other contact hole structures in a second lateral direction orthogonal to the first lateral direction by at least two channel structures in the second lateral direction from a respective one of the at least two contact hole structures.

14. The 3D memory device of claim 1, wherein each contact hole structure of the plurality of contact hole structures is separated from six closest contact hole structures by at least two channel hole structures.

15. The 3D memory device of claim 8, wherein the insulating structure extends laterally in the first lateral direction parallel to the TSG cut.

16. The 3D memory device of claim 15, wherein a parallel row comprising contact structures and channel structures is disposed in parallel to and between the insulating structure and the TSG cut and separated from the insulating structure and the TSG cut by a plurality of rows of channel structures.

17. A three-dimensional (3D) memory device, comprising:

a substrate;

a memory stack comprising interleaved conductive layers and dielectric layers over the substrate;

an array of channel structures each extending vertically through the memory stack;

an insulating structure extending vertically through the array of channel structures and laterally along a boundary of the array of channel structures;

a plurality of contact hole structures each extending vertically through the memory stack and electrically connected to a common source of one or more of the channel structures, each of the plurality of contact hole structures being surrounded by a plurality of the channel structures; and a top select gate (TSG) cut extending vertically through part of the memory stack and laterally along a first lateral direction, wherein at least two contact hole structures of the plurality of contact hole structures are disposed in the TSG cut and are separated by at least two channel structures also disposed in the TSG cut.

18. The 3D memory device of claim 17, wherein each of the plurality of contact hole structures is surrounded by a same number of the plurality of channel structures having nominally equal lateral distances to the respective contact hole structure, the respective contact hole structure being electrically connected to a common source of the respective plurality of the channel structures surrounding that contact hole structure.

19. The 3D memory device of claim 18, wherein the plurality of the channel structures are located adjacent to the respective contact hole structure.

20. The 3D memory device of claim 17, wherein in a plan view, the plurality of contact hole structures are arranged in an array; and the insulating structure comprises a dielectric material, and the plurality of contact hole structures each comprises a conductive material.

* * * * *